United States Patent [19]

Buil

[11] Patent Number: 4,906,811
[45] Date of Patent: Mar. 6, 1990

[54] PROCESS AND DEVICE FOR IGNITING AN ARC WITH A CONDUCTING PLASMA CHANNEL

[75] Inventor: Boudewijn J. A. M. Buil, Belfeld, Netherlands

[73] Assignee: Hauzer Holding B.V., Venlo, Netherlands

[21] Appl. No.: 71,887

[22] Filed: Jul. 10, 1987

[30] Foreign Application Priority Data

Jul. 11, 1986 [NL] Netherlands .................. 8601824

[51] Int. Cl.$^4$ .............................................. B23K 9/06
[52] U.S. Cl. ..................... 219/121.59; 219/121.54; 219/121.57; 219/121.55; 219/130.4
[58] Field of Search ................. 219/121 PU, 121 PT, 219/121 PQ, 121 P, 121 PG, 121 PD, 121 PY, 121 EB, 121 EM, 130.4; 204/192, 164; 156/643–646, 345; 427/34

[56] References Cited

U.S. PATENT DOCUMENTS

| 3,007,030 | 10/1961 | Ducati | 219/121 PU |
| 3,083,289 | 3/1963 | Munroe et al. | 219/121 PU |
| 3,836,451 | 12/1968 | Snaper | 204/298 |
| 3,961,103 | 6/1976 | Aisenberg | 427/34 |
| 4,264,393 | 4/1981 | Gorin et al. | 204/298 EG |
| 4,340,461 | 7/1982 | Hendricks et al. | 204/298 EG |
| 4,367,114 | 1/1983 | Steinberg et al. | 204/298 EG |
| 4,474,659 | 10/1984 | Fazlin | 204/298 EG |
| 4,496,423 | 1/1985 | Walton | 204/298 EG |
| 4,579,623 | 4/1986 | Suzuki et al. | 204/298 EG |
| 4,738,748 | 4/1988 | Kisa | 204/298 EG |

FOREIGN PATENT DOCUMENTS 7133634  5/1972  France .

Primary Examiner—M. H. Paschall
Attorney, Agent, or Firm—Harness, Dickey & Pierce

[57] ABSTRACT

Process and device for creating a conducting channel for igniting of an arc in an environment with reduced pressure by means of high voltage. During ignition the conditions for ignition of the arc are optimized at a number of points between the parts where the arc has to be ignited. This optimization can comprise increasing of pressure and/or adding ignition-promoting gases.

44 Claims, 2 Drawing Sheets

6-SUPPLY SOURCE
14-VARISTOR
15-CAPACITOR
17-AUXILIARY VOLTAGE
18-AUXILIARY VOLTAGE
19-SUPPLY RECTIFIER
20-DETECTION CIRCUIT

PROCESS AND DEVICE FOR IGNITING AN ARC WITH A CONDUCTING PLASMA CHANNEL

BACKGROUND OF THE INVENTION

The present invention relates to a process for creating a conducting plasma channel for igniting an arc in an environment with reduced pressure by means of high voltage.

Such a process is known from WO-8,503,954. This patent publication discloses a new process for the ignition of an arc which, in contrast to the process known from U.S. Pat. No. 3,783,231 and U.S. Pat. No. 3,836,451 makes use of non-mechanical means for igniting an arc. This has the advantage that the device can be made smaller and is more reliable because of the absence of moving parts. This ignition described in WO-8,503,954 is called plasma-electronic ignition of the arc. In order to make this ignition possible, the anode and the cathode must be close together, while the optimum pressure must be higher than that which is usual for the deposition of metals in vacuum. This process has, however, a number of disadvantages. Due to the fact that the cathode and the anode are close to each other, deposition of material gives rise to the risk of the cathode and anode being short-circuited. In addition, the chamber containing the cathode and anode together with the substrate must be placed under a higher pressure during the ignition of the arc, after which the pressure has to be reduced again in order to allow the vacuum deposition on the substrate to proceed in optimum conditions.

The object of the present invention is to avoid these disadvantages.

SUMMARY OF THE INVENTION

To this end, in the above-mentioned process the conditions for ignition of the arc are optimized at only a limited number of points between the parts where the arc has to be ignited. This means that, if it is the pressure which is concerned, the pressure is increased locally and/or the ignition-promoting gases are fed in.

The invention also relates to a device for achieving the above-described process, comprising a pipe for supplying the gases to the point where the ignition must begin.

If this pipe is connected as an auxiliary anode or a separate auxiliary anode is provided near this pipe, the distance between the anode and the cathode can be increased, so that the above-described problems concerning the risk of short-circuiting can be eliminated.

The risk of short-circuiting can be further reduced by fitting an insulating ring between cathode and anode, which is made, for example, from a ceramic material such as boron nitride.

It is also possible to provide for the automatic re-ignition by detection of the cutting out of the arc current by means of, for example, current or voltage detection. The latter gives an ignition pulse via ignition circuit 6 if there is complete failure of the arc.

BRIEF DESCRIPTION OF THE DRAWINGS

The invention will now be explained in greater detail with reference to an example shown in the drawing, in which.

Figure 1:
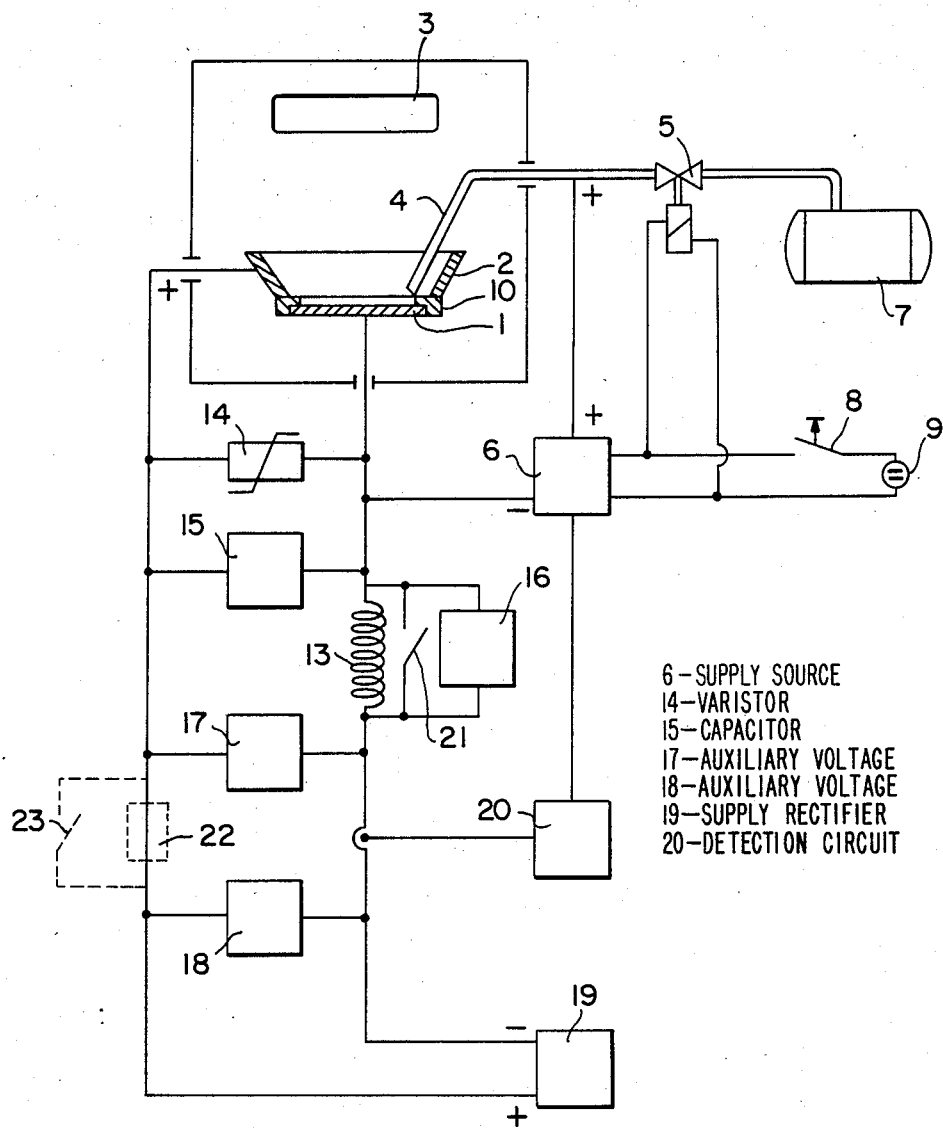
FIG. 1 shows a schematic view of a device according to the invention with a pipe connected as an auxiliary electrode and an electric circuit for ignition of the arc, feeding and stabilizing the arc, automatic ignition of the arc when it has failed, and a device to protect the electric circuit against excessive overvoltage, without affecting the dynamic stabilization of the arc.

The device shown in FIG. 1 comprises a cathode 1 and an anode 2, between which an arc must be struck. Material thereby migrates from the cathode 1 to a substrate 3 which is to be coated. How this substrate is arranged is not shown, but this can take place in all the ways known in the art. The combination described above is disposed in a chamber (not shown), in which the pressure can be reduced, so that the deposition of material on the substrate 3 can be optimized. To ignite the arc, a pipe 4 is present which serves as the auxiliary electrode. By means of this pipe, gas can be fed in via a valve 5 and a source 7 to the point where an auxiliary ignition between the cathode 1 and the auxiliary electrode 4 has to take place for producing the arc. The end of the pipe 4 lying at cathode 1 or the whole pipe can be made of a heat-resistant material, such as molybdenum or tungsten. Through the application of a voltage pulse between cathode 1 and pipe 4 and simultaneously increasing the pressure locally by feeding in a gas such as argon, optimum conditions for the production of an arc can be provided, in other words, at a particular distance between the cathode 1 and auxiliary electrode 4 a minimal voltage pulse is needed. According to the Paschen-Back law of ignition voltage, there is a minimum ignition voltage for each gas for a particular value of the product of the prevailing pressure and the electrode spacing. This product can be found for each gas from the relevant Paschen curve. At a particular value for this product, the pressure or pressure impulse for minimal ignition voltage must be selected in such a way that it is either equal to the pressure of the process of coating or the latter is not adversely affected. The electrode spacing is therefore set with any safety margin necessary for reproducibility of the ignition at a particular ignition voltage. The inside of pipe 4 is formed in such a way that from it a directed gas flow can be applied to the desired point for the ignition. For this, the inside can - as shown - be cylindrical, but it can also be designed as a venturi nozzle.

The device also has a supply source 6 for the ignition of the arc and a supply source 19 for maintaining the arc between cathode 1 and anode 2. There is also a usual supply source 9 and closing switch 8 both opens valve 5 and applies voltage to pipe 4. This produces ionization of the gases at the outflow end of pipe 4, which produces a conducting channel between anode 2 and cathode 1. During the time that this conducting channel is present, the current must be able to increase to a value at which an arc discharge can form between cathode 1 and anode 2 and can be stably maintained with a low voltage. To optimize the process (brief pressure increase, small quantity of gas) the duration of time in which the conducting channel is present is short. Characteristic of the electric circuit used is the fact that it is capable of increasing the current in the conducting channel so quickly that a stable arc discharge at low voltage between cathode 1 and anode 2 can occur despite the presence of choke coil 13 which has to have a great coefficient of self-induction to maintain the arc. Working in this way means that, on ignition of the arc, the whole chamber does not need to be placed under a higher pressure or provided with special gases, but local pressure increase will be sufficient, so that immediately after the production of an arc optimum conditions prevail for the deposition of a coating on substrate 3. Consequently, large vacuum pumps are unnecessary, while there is also a saving on the quantity of gas. In order to avoid short-circuiting between cathode 1 and anode 2 due to undesirable deposition of evaporation material on anode 2, the gap between cathode 1 and anode 2 must be considerably greater than in the device according to the state of the art. This can also be achieved by providing an insulating ring 10, which can be made of ceramic material such as boron nitride, between cathode 1 and anode 2. Making at least the end of pipe 4 of tungsten or molybdenum means that blocking thereof due to melting is avoided.

Supply source 6 must be designed in such a way that it can produce a high voltage (between several hundred volts and several kilovolts) at low power. Moreover, provision is made in the circuit for a choke coil 13 which provides not only for smoothing of the current for shifting the gap limit, by means of which the average current at which the arc runs can be reduced, but also provides for maintenance of the arc if the latter has a tendency to fail (dynamic stabilization of the arc). As soon as the arc current decreases rapidly, a high induced voltage which permits stabilization of the arc is produced.

After the conducting channel is produced, the current from the supplying rectifier 19 must increase rapidly. Since for cost reasons this rectifier 19 can only give off a relatively low voltage, it takes a long time before the current in the choke coil 13 has reached such a value that the arc remains stable at low voltage. That is why a number of means are provided to solve this problem. A possible solution is to apply an auxiliary voltage 17, comprising a capacitor which is charged by a separate voltage source (not shown). Once a conducting channel has been produced, the precharged capacitor is discharged via choke coil 13 over the conducting channel. The increase in the current is determined by the capacitor voltage, the size of the choke coil, and the capacity of the capacitor. This causes the current to rise much faster than if said increase were caused by the supply rectifier 19 alone. This auxiliary voltage can be achieved with low power. This means that the supply rectifier 19 need not have a considerable capacity, which gives rise to the above-mentioned cost saving. The provision of an auxiliary voltage can also be achieved through auxiliary circuit 18, which is a voltage source (e.g. fully-controlled rectifier) with a current limiting resistor connected in series in the output. In principle, the operation is based on reduction of the time constant L/R, in which L is the coefficient of self-induction of the choke coil 13, and R is the resistance value of the current limiting resistor. Immediately after the main supply rectifier supplies current, the auxiliary rectifier is switched off. The auxiliary rectifier has only a low continuous power, since it supplies current for only a very short time. The auxiliary voltage source 18 can, if necessary, have the same voltage value as the main supply rectifier 19. In this special case the current limiting resistor R can be provided, as described above, in the main current, and auxiliary circuit 18 is not needed. This is shown as resistor 22 in the figure. Once the arc has been ignited, the resistor 22 is short-circuited by means of switch 23. In the event of the auxiliary circuit 18 being used, the resistance is equivalent to zero, which makes switch 23 unnecessary. It goes without saying that auxiliary circuit 17 and 18 can be used either separately or combined.

The overvoltages which occur in the circuit mean that the use of a protection device against overvoltage is necessary. For this, varistor 14, for example, can be used. When the arc is interrupted, a considerable induction voltage occurs over choke coil 13, which could result in damage to the device, and by use of this varistor 14 these overvoltages are limited, while voltages below the response value of the varistor are used for stabilization of the arc (dynamic stabilization). This protection device can also be provided by using the precharged capacitor 15. Here, capacitor 15 is used when average to large magnetic energy is stored in choke coil 13, while varistor 14 is used for fairly low storage of magnetic energy. Through the use of the capacitor, overvoltages of the choke coil 13 below the bias voltage of the capacitor are used for stabilization of the arc (dynamic stabilization). Finally, means 16, 21 can be used as protection against overvoltage. Here, a semiconductor element is caused to conduct by a control signal and is parallel to choke coil 13. The control signal is given at the instant when an induced voltage above a certain level arises on the coil. This means that the whole circuit is protected against excessive induced voltages, on the one hand, while induced voltages below the set level can be used for the dynamic stabilization of the arc, on the other. The said semiconductor can be a thyristor or transistor circuit or any other element known in the state of the art which is capable of blocking sufficiently high voltage in the forward direction. For the control signal, elements with a breakover characteristic (controlled breakdown) can be used. The later-described means can in particular be used where large quantities of energy are stored in the choke coil 13. The above-described circuits 14, 15 and 16 can be used in all conceivable combinations to achieve optimum protection.

The figure also shows detection circuit 20, which detects the failure of the arc. This can take place by means of current or voltage detection. After failure of the arc, an ignition pulse is given automatically by means of ignition circuit 6. Here, switch 21 can be used to short-circuit fully or partially choke coil 13 on ignition of the arc. This means that during the ignition of the arc the coefficient of self-induction of the choke coil is reduced, which causes a rise in the arc current. Once the arc is under way, the short-circuit switch is opened, which results in the choke coil 13 having a greater coefficient of self-induction and producing better smoothing of the current and greater dynamic stabilization of the arc.

Figure 2:
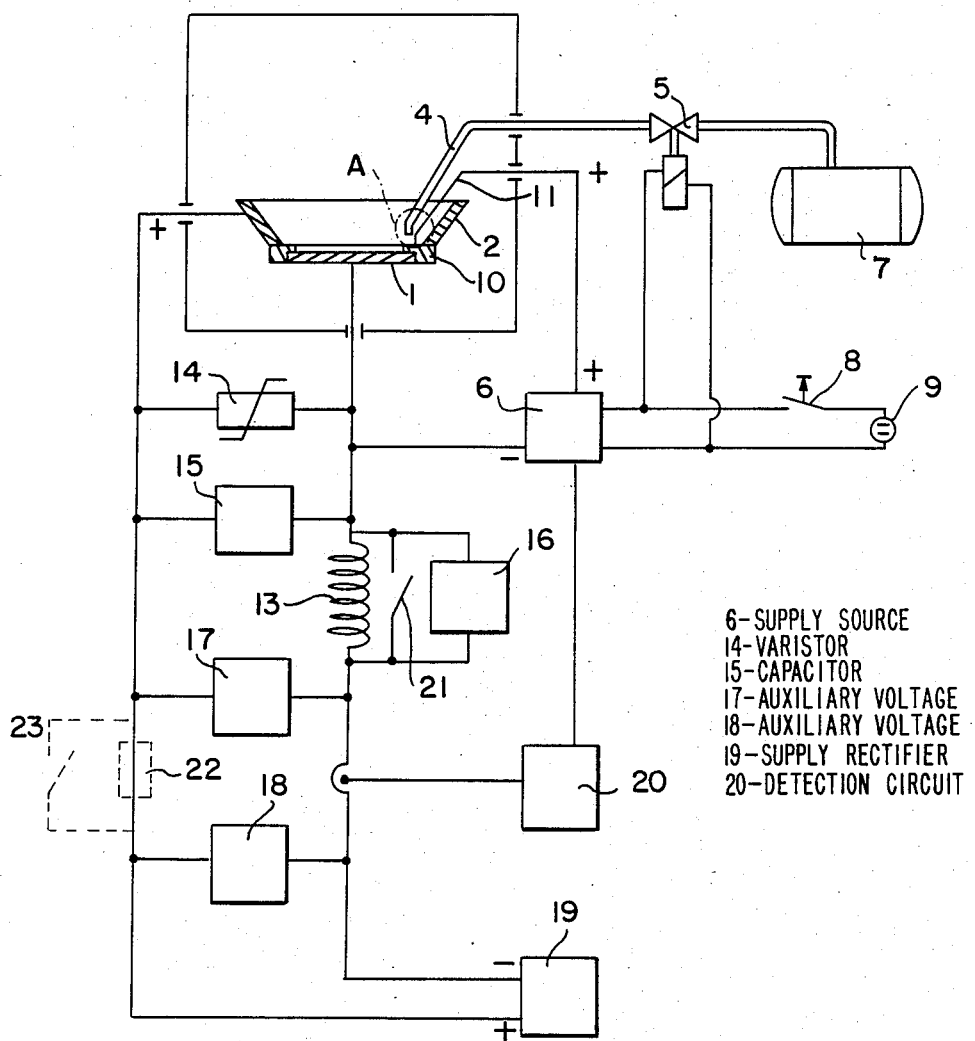
FIG. 2 shows the device according to FIG. 1, but with a separate auxiliary electrode.
Figure 3:
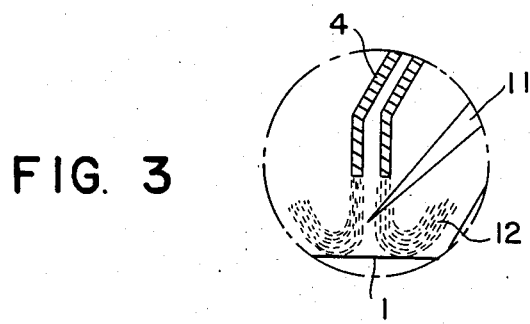
FIG. 3 shows detail (a) from FIG. 2.

FIG. 2 shows another embodiment of the invention, in which a separate auxiliary electrode 11 is disposed next to pipe 4. This auxiliary electrode can also be made of tungsten or molybdenum. In this way an optimum flow of gas along the auxiliary electrode can be ensured, while the point of the auxiliary electrode 11 can also be formed in the optimum manner. FIG. 3 shows a detail A of FIG. 2. It shows in particular the special outlet shape of pipe 4 with the gas flow 12 produced from it.

Although only one auxiliary electrode is shown in FIG. 2, several auxiliary electrodes can be disposed around a pipe. Moreover, there can be several pipes 4 in a device, connected as auxiliary electrode or otherwise. The auxiliary electrode 11 and the pipes 4 are without voltage after ignition of the arc and are electrically floating relative to cathode, anode and chamber.

Although the embodiment described here is currently the preferred one, it must be understood that modifications can be made to it by those skilled in the art, without going beyond the scope of the present invention.

I claim:

1. A process for igniting an electric arc between an anode element and a cathode element in an environment of subatmospheric pressure, said arc acting to evaporate material of which the cathode element is made for deposition on a substrate, comprising the steps of:
   (a) locally and temporarily increasing gas pressure in an area of said environment surrounding an anode element and said cathode element, and
   (b) inducing an electrical discharge for only sufficient time to generate ignition of an arc between said anode and cathode element and thereafter discontinuing the increase of said pressure.

2. The process as set forth in claim 1, wherein pressure is locally increased in an area surrounding an auxiliary electrode which is charged only for sufficient time to light the arc.

3. The process as set forth in claim 2, wherein local pressurization in said environment is obtained by localized introduction of a gas into said environment.

4. The process as set forth in claim 3, wherein said electrical discharge between said anode element and said cathode element ionizes the gas within the localized area of said environment producing an electrical conducting channel between electrode elements within the localized area.

5. The process as set forth in claim 3, wherein said gas possesses a characteristic of promoting ignition of the arc.

6. The process as set forth in claim 3, wherein said gas is introduced through a pipe.

7. The process as set forth in claim 6, wherein said pipe is disposed to supply gas in the area of the environment in which the arc is to be ignited, near the point where the ignition is to take place.

8. The process as set forth in claim 7, wherein said pipe is made of a conducting material and acts as the auxiliary electrode for generating ignition of the arc.

9. A device for igniting an electric arc between an anode element and a cathode element positioned in a chamber having an environment of subatmospheric pressure comprising
   (a) means for temporarily locally increasing gas pressure in an area of said chamber environment surrounding an anode element and a cathode element and,
   (b) means for inducing an electrical discharge for only sufficient time to generate ignition of the arc between said anode and cathode elements an thereafter discontinuing the increase of said pressure.

10. A device as set forth in claim 9, comprising an auxiliary electrode for inducing an electrical discharge.

11. A device as set forth in claim 9, wherein said means for locally increasing pressure in an area of said chamber environment surrounding said anode element and said cathode element comprises a pipe disposed to introduce gas flow therethrough into a select area said chamber environment, thereby locally increasing pressure in the subatmospheric pressure environment.

12. A device as set forth in claim 11, wherein said pipe is disposed to supply gas into a localized area said chamber environment in which the arc is to be ignited.

13. A device as set forth in claim 12, wherein said pipe is disposed near the point where the ignition of the arc is to take place.

14. A device as set forth in claim 12, additionally comprising an auxiliary electrode which is connected to said means for inducing an electrical discharge and which is disposed so that an electrical discharge will occur within the area of said subatmospheric pressure environment in which pressure has been locally increased.

15. A device as set forth in claim 13, wherein said pipe is made of an electrically conducting material and is connected to said means for inducing an electrical discharge to serve as an auxiliary electrode for inducing an electrical discharge.

16. A device as set forth in claim 15, wherein said pipe is made of tungsten or molybdenum.

17. A device as set forth in claim 14, comprising a plurality of auxiliary electrodes disposed to generate ignition of the arc within areas of said subatmospheric pressure environment in which pressure has been locally increased.

18. A device as set forth in claim 15, having a plurality of said pipes made of electrically conducting material connected to said means for inducing an electrical discharge.

19. A device as set forth in claim 9, wherein said anode element and said cathode element are separated by an insulating means disposed there between.

20. A device as set forth in claim 19, wherein said insulating means comprising a ring-shaped insulator disposed between an anode having a circular configuration and the cathode.

21. A device as set forth in claim 20, wherein said insulating means is comprised of boron nitride material.

22. A device as set forth in claim 9, having power source means for supplying electrical current for maintaining existence of an arc once it is ignited, said power source means comprising an electrical circuit between said anode element and said cathode element.

23. A device as set forth in claim 9, wherein said ignition means comprises a voltage supply source means capable of producing high voltage at low power, and said device additionally comprises control means for operating said voltage supply source means.

24. A device as set forth in claim 22, additionally comprising a choke coil connected in series with said power source means circuit for maintaining the arc.

25. A device as set forth in claim 24, wherein said power source means has a characteristic of being capable of rapidly generating an increase in electrical current.

26. A device as set forth in claim 25, wherein said power source means is a rectifier and additionally comprises auxiliary voltage supply source means for generating voltage over said power source means circuit including said choke coil.

27. A device as set forth in claim 26, wherein said auxiliary source means for supplying voltage comprises a charged capacitor.

28. A device as set forth in claim 27, wherein said auxiliary source means for supplying voltage includes a separate voltage source means for charging said capacitor.

29. a device as set forth in claim 27, wherein said charged capacitor is connected in parallel with said power source means circuit for maintaining the arc.

30. A device as set forth in claim 26, wherein said auxiliary source means for supplying voltage comprises a separate voltage source means having a current limiting resistor connected in series with said separate voltage source means.

31. A device as set forth in claim 30, wherein said separate voltage source means is a fully-controlled rectifier.

32. A device as set forth in claim 26, wherein said auxiliary source means for supplying voltage comprises a voltage source means and a resistor connected in series with said power source means circuit, said circuit additionally comprising short-circuiting means to by-pass said resistor.

33. A device as set forth in claim 22, additionally comprising means for limiting voltage to protect said device from overvoltages occurring due to variations in electrical conduction of the arc.

34. A device as set forth in claim 33, wherein said means for limiting voltage comprises an overvoltage limiting component connected parallel with said power source means to limit voltage in said power source circuit below a select voltage value, lower voltages being permitted to vary to dynamically stabilize said arc.

35. A device as set forth in claim 34, wherein said overvoltage limiting component comprises a varistor.

36. A device as set forth in claim 34, wherein said overvoltage limiting component comprises a capacitor, and in particular a precharged capacitor.

37. A device as set forth in claim 33, wherein said means for limiting voltage comprises over voltage limiting component connected in parallel with said choke coil to limit voltage in said power source circuit below a select voltage value, lower voltages being permitted to vary to dynamically stabilize said arc.

38. A device as set froth in claim 37, wherein said overvoltage limiting component comprises a semiconductor element, said semiconductor element being controlled by a control signal generated from a signal means in response to induced voltage above a certain select value in said choke coil.

39. A device as set forth in claim 38, wherein said overvoltage limiting component is a thyristor.

40. A device as set forth in claim 38, wherein said overvoltage limiting component is a transistor circuit capable of blocking high voltages over a select valve, in at least one conducting direction.

41. A device as set forth in claim 24, additionally comprising means for detecting failure or extinguishment of the arc and providing a control signal to said means for igniting the arc to induce an electrical discharge.

42. A device as set forth in claim 41, additionally comprising short circuit means to by-pass said choke coil.

43. A device as set forth in claim 41, wherein said detecting means is an electrical voltage detection circuit connected between said power source means circuit and said means for igniting the arc.

44. A device as set forth in claim 41, wherein said detecting means is an electrical current detection circuit connected between said power source means circuit and said means for igniting the arc.

* * * * *